United States Patent
Lin et al.

(10) Patent No.: US 12,221,371 B2
(45) Date of Patent: Feb. 11, 2025

(54) SYSTEMS AND METHODS FOR PRODUCING ULTRAPURE WATER FOR SEMICONDUCTOR FABRICATION PROCESSES

(71) Applicant: Taiwan Semiconductor Manufacturing Company, Hsinchu (TW)

(72) Inventors: En Tian Lin, Taoyuan (TW); Shih-Hsiung Chiang, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 185 days.

(21) Appl. No.: 17/699,371

(22) Filed: Mar. 21, 2022

(65) Prior Publication Data

US 2023/0295027 A1      Sep. 21, 2023

(51) Int. Cl.
*C02F 9/00* (2023.01)
*G03F 7/00* (2006.01)
(Continued)

(52) U.S. Cl.
CPC ............ *C02F 9/00* (2013.01); *G03F 7/2041* (2013.01); *G03F 7/70341* (2013.01); *C02F 1/20* (2013.01);
(Continued)

(58) Field of Classification Search
CPC .... C02F 9/00; C02F 1/20; C02F 1/283; C02F 1/32; C02F 1/441; C02F 1/444; C02F 1/722; C02F 1/725; C02F 1/78; C02F 3/1268; C02F 2101/30; C02F 2103/04; C02F 2103/346; C02F 2301/046;
(Continued)

(56) References Cited

U.S. PATENT DOCUMENTS

| | | | | |
|---|---|---|---|---|
| 5,480,548 | A | * 1/1996 | Daigger | C02F 3/308 |
| | | | | 210/906 |
| 6,365,048 | B1 | * 4/2002 | Masten | C02F 3/085 |
| | | | | 210/617 |
| 2012/0223012 | A1 | * 9/2012 | Gokcay | C02F 1/78 |
| | | | | 210/620 |

FOREIGN PATENT DOCUMENTS

| | | | |
|---|---|---|---|
| CN | 111777244 A | * 10/2020 | |
| CN | 112771007 A | * 5/2021 | ............... C02F 9/00 |

(Continued)

OTHER PUBLICATIONS

Jose Antonio Garrido-Cardenas, Belen Esteban-Garcia, Ana Agüera, Jose Antonio Sanchez-Perez, Francisco Manzano-Agugliaro, Wastewater Treatment by Advanced Oxidation Process and Their Worldwide Research Trends, International Journal of Environmental Research and Public Health, 2020, 17, 170, p. 1-19 (Year: 2020).*
(Continued)

*Primary Examiner* — Chester T Barry
(74) *Attorney, Agent, or Firm* — Lippes Mathias LLP

(57) ABSTRACT

Systems and methods for producing ultrapure water (UPW) for use in semiconductor fabrication include an ABA module that performs an advanced oxidation process (AOP) pretreatment step, a bioremediation step, and an advanced oxidation process post-treatment step. Raw water flows through the ABA module, which is part of a water treatment system for producing ultrapure water. The ultrapure water is then used in a semiconductor fabrication process.

20 Claims, 10 Drawing Sheets

(51) Int. Cl.
| | |
|---|---|
| G03F 7/20 | (2006.01) |
| C02F 1/20 | (2023.01) |
| C02F 1/28 | (2023.01) |
| C02F 1/32 | (2023.01) |
| C02F 1/44 | (2023.01) |
| C02F 1/72 | (2023.01) |
| C02F 1/78 | (2023.01) |
| C02F 3/12 | (2023.01) |
| C02F 101/30 | (2006.01) |
| C02F 103/04 | (2006.01) |
| C02F 103/34 | (2006.01) |

(52) U.S. Cl.
CPC ............ *C02F 1/283* (2013.01); *C02F 1/32* (2013.01); *C02F 1/441* (2013.01); *C02F 1/444* (2013.01); *C02F 1/722* (2013.01); *C02F 1/725* (2013.01); *C02F 1/78* (2013.01); *C02F 3/1268* (2013.01); *C02F 2101/30* (2013.01); *C02F 2103/04* (2013.01); *C02F 2103/346* (2013.01); *C02F 2301/046* (2013.01); *C02F 2301/08* (2013.01); *C02F 2305/10* (2013.01)

(58) Field of Classification Search
CPC ............ C02F 2301/08; C02F 2305/10; C02F 3/1226; C02F 1/42; C02F 1/44; C02F 1/72; C02F 1/001; C02F 3/02; C02F 2001/007; G03F 7/70908; H01L 21/0274

See application file for complete search history.

(56) References Cited

FOREIGN PATENT DOCUMENTS

| | | | |
|---|---|---|---|
| JP | H074592 | B2 * | 12/1991 |
| JP | 3413883 | B2 * | 6/2003 |
| KR | 101035899 | * | 5/2011 |
| TW | 201142544 | A1 | 12/2011 |
| TW | M582501 | U | 8/2019 |

OTHER PUBLICATIONS

Wei-Guang Ii, Wen Qin, Impact of ozonation and biologically enhanced activated carbon filtration on the composition of micropollutants in drinking water, Environmental Science and Pollution Research, Springer 2018 (Year: 2018).*

Pei Wang, Meng Zhang, Yonglong Lu', Jing Meng, Qifeng Li, Xiaotian Lu, Removal of perfluoalkyl acids (PFAAs) through fluorochemical industrial and domestic wastewater treatment plants and bioaccumulation in aquatic plants in river and artificial wetland, Environment International 129 (2019) 76-85 (Year: 2019).*

Pei Wang et al, Removal of Perfluoalkyl Acids (PFAAs) through Fluorochemical Industrial and Domestic Wastewater Treatment Plants and Bioaccumulation in Aquatic Plants in River and Artificial Wetland, Environment International, Apr. 30, 2019, Entire Document, Published by Elsevier Ltd.

Jose Antonio Garrido-Cardenas et al, Wastewater Treatment by Advanced Oxidation Process and Their Worldwide Research Trends, International Journal of Environmental Research and Public Health, Dec. 25, 2019, entire document, published by MDPI.

Wei-Guang Li et al, Impact of Ozonation and Biologically Enhanced Activated Carbon Filtration on the Composition of Micropollutants in Drinking Water, Environmental Science and Pollution Research, Jul. 12, 2018, Entire Document, Published by Springer-Verlag GmbH Germany.

* cited by examiner

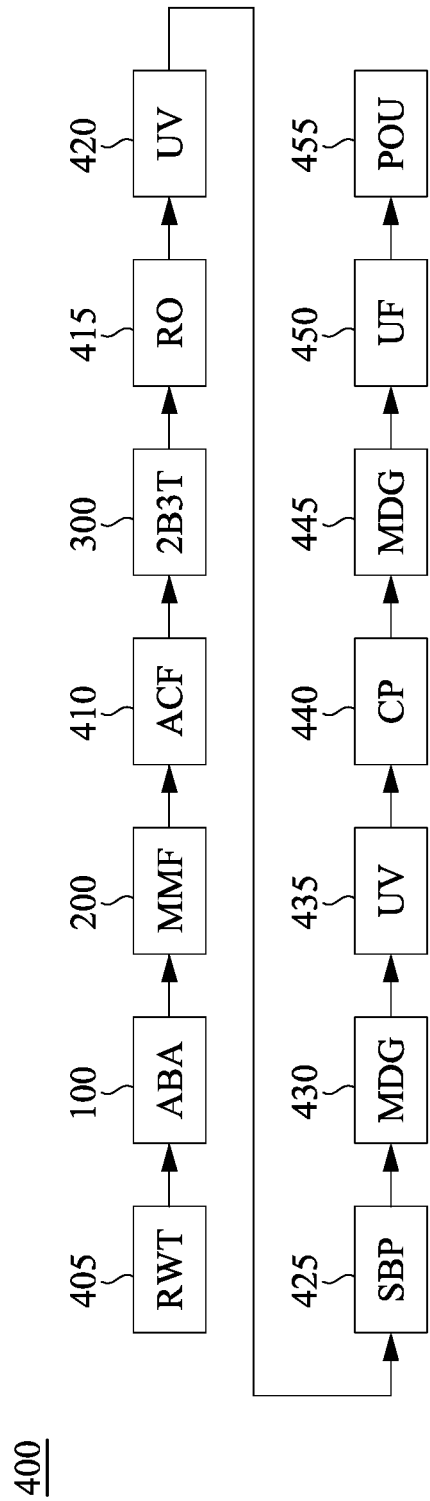
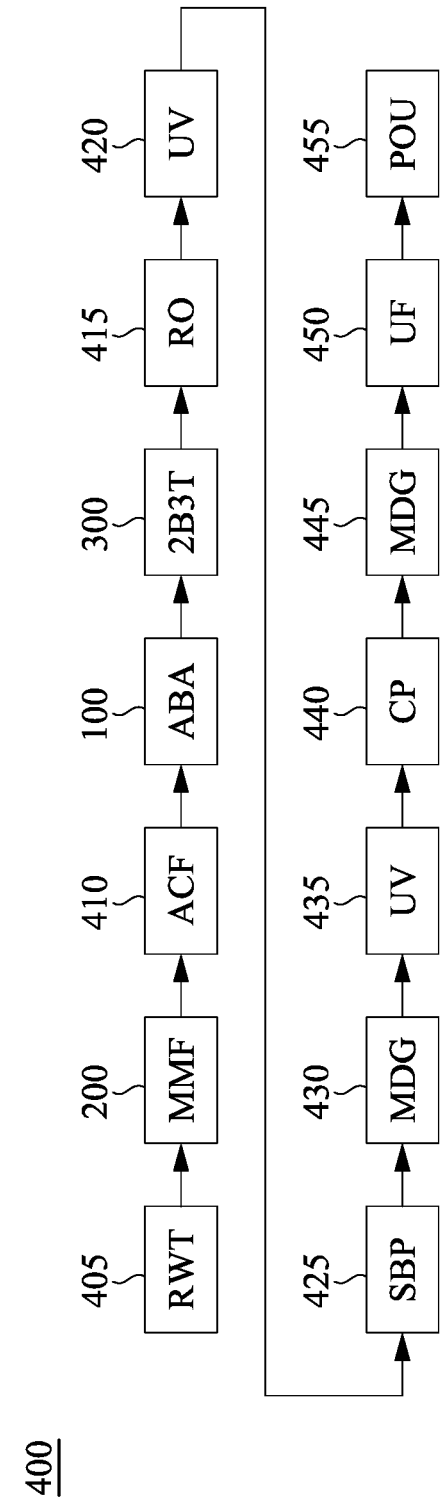
Fig. 4A
Fig. 4B

SYSTEMS AND METHODS FOR PRODUCING ULTRAPURE WATER FOR SEMICONDUCTOR FABRICATION PROCESSES

BACKGROUND

Integrated circuits are formed on a semiconductor wafer. Photolithographic patterning processes use ultraviolet light to transfer a desired mask pattern to a photoresist on a semiconductor wafer. Etching processes may then be used to transfer to the pattern to a layer below the photoresist. This process is repeated multiple times with different patterns to build different layers on the wafer substrate and make a useful device. Ultrapure water (UPW) is required for many aspects of semiconductor fabrication, for example rinsing the wafer to remove debris between individual manufacturing steps, or as the liquid medium for immersion photolithography.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A is a first water treatment system for semiconductor fabrication purposes, in accordance with some embodiments.

FIG. 4B is a second water treatment system, in accordance with some embodiments.

DETAILED DESCRIPTION

Figure 1A:
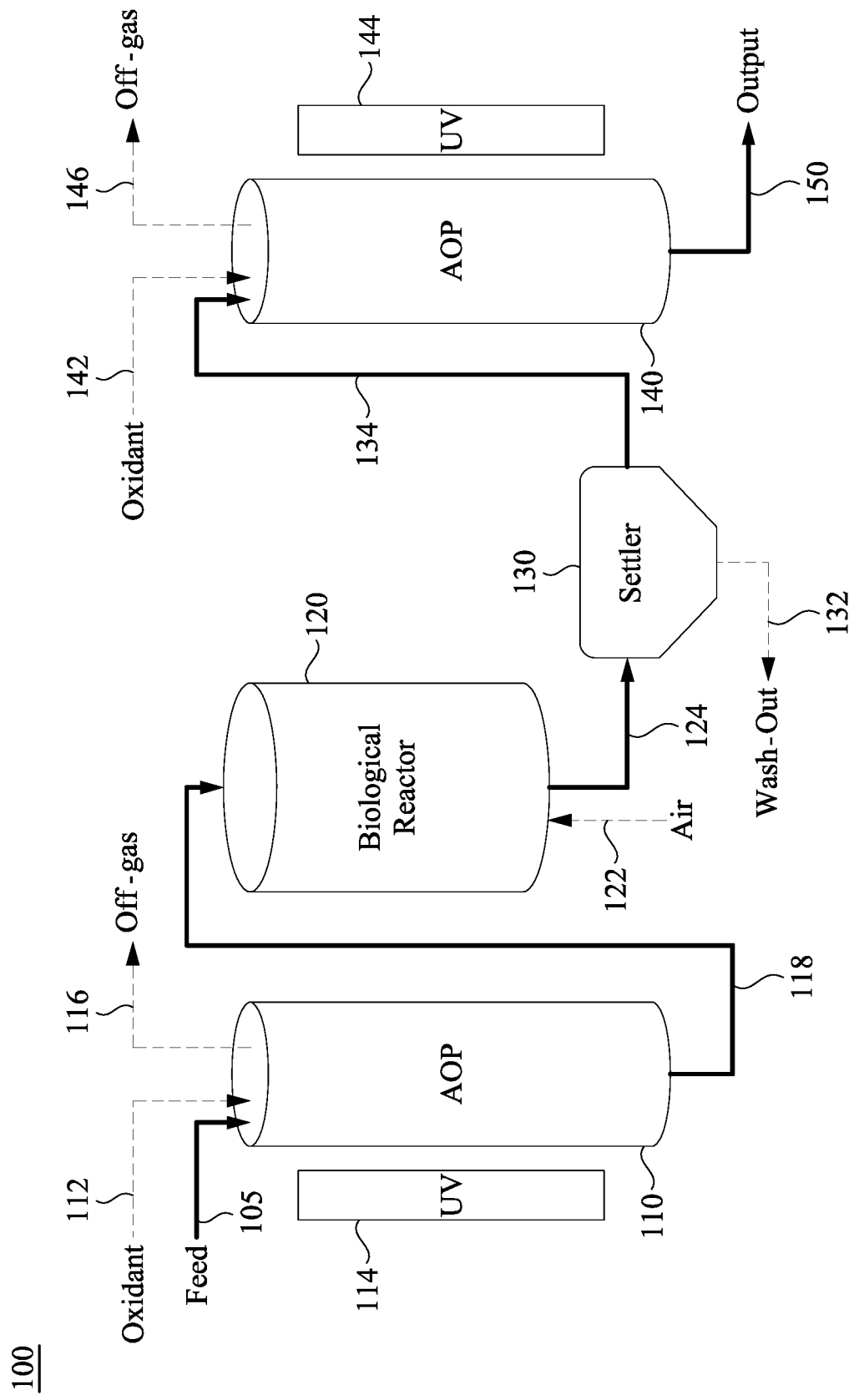
FIG. 1A is a first example embodiment of an ABA module, in accordance with the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "inlet" and "outlet" are relative to a fluid flowing through them with respect to a given structure, e.g. a fluid flows through the inlet into the structure and flows through the outlet out of the structure. The terms "upstream" and "downstream" are also relative to the direction in which a fluid flows through various components, i.e. the flow fluids through an upstream component prior to flowing through the downstream component. It should be noted that when a loop is present, a first component can be described as being both upstream of and downstream of a second component.

The term "fluidly connected" is used in the specification to indicate that two components are connected to each other in such a way that a fluid in one component will eventually reach the second component. This term permits other structures and components to be present between the two fluidly connected components.

The term "directly" is used to indicate that the fluid in the first component subsequently flows into the second component, with no other components between them that affect the makeup of the fluid.

The present disclosure refers to systems and methods for treating water to obtain ultrapure water. The terms "raw water" and "treated water" may be used interchangeably to refer to water flowing into a water treatment unit, regardless of whether the water has already passed through a prior water treatment unit. Put another way, any water which is not the final ultrapure water may be referred to as "raw water" or "treated water".

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The present disclosure relates to systems and methods for producing ultrapure water (UPW) for semiconductor fabrication purposes. As some background, a single fabrication plant may use 2 million to 5 million gallons (7500 to 19000 cubic meters) of UPW daily. Stable water quality, i.e. water in which the concentration of each given contaminant varies only within a very small range, is desirable. In addition, ideally, the concentration of each given contaminant is very low in absolute amounts as well.

Ultrapure water is prepared by processing of "raw" water from conventional water treatment facilities. Raw water may have high total organic carbon (TOC) content. In addition, raw water may also contain other contaminants or pollutants from other sources, such as dimethylamine, chlorinated dimethylamine, N-nitrosodimethylamine, dimethylformamide, isobutyraldehyde. Pesticides or herbicides may also be present in raw water, such as triazines like atrazine, ametryn, desethylatrazine, or desisopropylatrazine; phenylureas like isoproturon; organophosphates such as glyphosate or aminomethylphosphonic acid; phenoxyacids like 2-methyl-4-chlorophenoxyacetic acid, 2,4-dichlorophenoxyacetic acid, methylchlorophenoxypropionic acid, dichlorophenylpiperazine, or 2-(4-chlorophenoxy)propionic acid; nitriles such as dichlobenil or 2,6-dichlorobenzamide; and others such as clopyralid, metamitron, metolachlor, acetochlor, chloridazon, chloridazon-desphenyl, or ethofumesate. Pharmaceuticals such as diclofenac or ibuprofen can also be found in raw water, as well as perfluorinated compounds such as perfluorobutane sulfonic acid, perfluorooctanoic acid, or perfluorooctane sulfonic acid. Other small molecules may also be present in raw water. Generally, these contaminants are already decomposed as far as possible, or are difficult to decompose via natural processes alone.

The presence of such contaminants can adversely affect semiconductor devices. For example, they can affect the ability to grow oxide films, or cause defects in various layers, or unintentionally dope some layers, or decrease the reliability of layers. As another example, TOC in the liquid medium for immersion lithography can absorb energy from the laser, causing defects, or can become deposited on the lens, causing haze and impairing lens performance. These contaminants must be removed before the water can be used in semiconductor fabrication processes.

Conventional water treatment processes include reverse osmosis (RO). Very generally, pressure is applied on one side of a partially permeable membrane to push water through the membrane and ideally retain any solute on the pressurized side. However, for example, the free-volume hole area of a polyamide membrane is 26 square angstroms ($Å^2$). Small molecules with a molecular projection area below this value, such as linear nitrogen-containing molecules, can also pass through the selective membrane and remain in the water, and thus are not removed by the reverse osmosis.

In the systems and methods of the present disclosure, raw water is treated in a water purification system that also includes an ABA module. The ABA module performs a first advanced oxidation process (AOP) treatment step, then a bioremediation step, then a second advanced oxidation process (AOP) treatment step (hence ABA from AOP, Bioremediation, AOP). As contemplated, the first AOP step acts as a pre-treatment, breaking covalent bonds so that the carbon can be used more easily by the biological components of the bioremediation step. The second AOP step acts as a post-treatment, converting remaining carbon into carbon dioxide ($CO_2$) which can subsequently be removed from the water stream. The resulting ultrapure water obtained is then used in a semiconductor fabrication process.

Figure 1B:
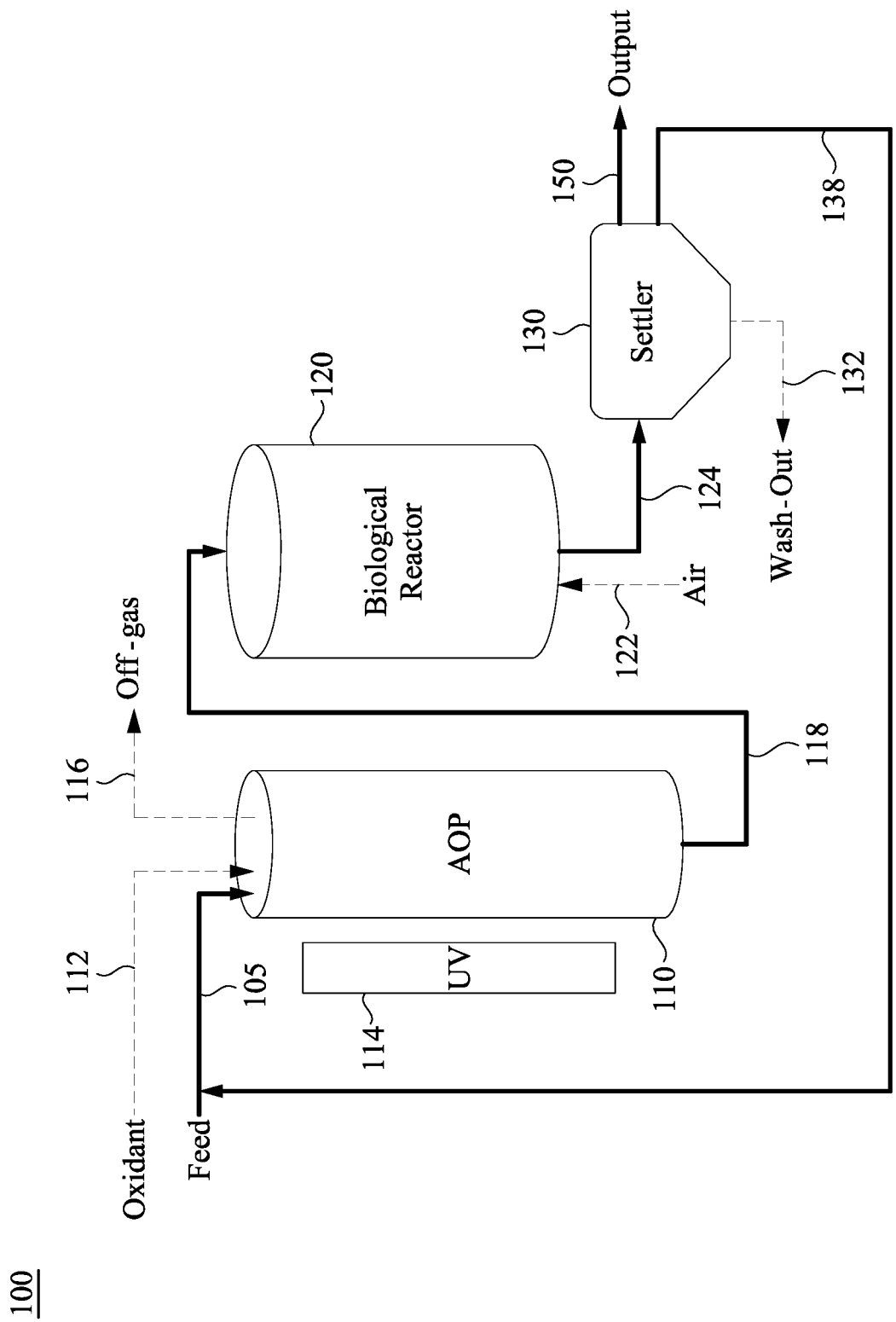
FIG. 1B is a second example embodiment of an ABA module, in accordance with the present disclosure.

FIG. 1A and FIG. 1B are two different embodiments of an ABA module, in accordance with the present disclosure. They differ between each other in the use of a recycle loop. In these figures, the flow of the raw water/treated water is indicated in thick dark line, and other flows (gaseous, liquid, solid, or mixtures) are indicated in dashed lines.

Referring first to FIG. 1A, the ABA module 100 is illustrated as including a first oxidation reactor 110, a biological reactor 120, a settler 130, and a second oxidation reactor 140. The first AOP pre-treatment is performed in the first oxidation reactor, the bioremediation is performed in the biological reactor, and the second AOP post-treatment is performed in the second oxidation reactor.

In an advanced oxidation process (AOP), organic materials are broken down by oxidation. Hydroxyl radicals are produced to oxidize any molecules present in the raw water. In addition, some metals can be precipitated out by reaction with the hydroxyl radicals. It is contemplated that the first oxidation reactor 110 and the second oxidation reactor 140 can generate hydroxyl radicals through any acceptable method.

As illustrated here, the inputs to the first oxidation reactor 110 can include at least one oxidant 112 along with the feed 105. Non-limiting examples of oxidants may include ozone ($O_3$), hydrogen peroxide ($H_2O_2$), oxygen ($O_2$), and sodium hypochlorite (NaClO). Catalysts, such as Fe or Ti or W or Zn, may also be introduced if desired. In some specific embodiments, ozone is used as the oxidant. In other specific embodiments, a combination of ozone and hydrogen peroxide is used as the oxidant. An ultraviolet light source 114 is used to provide energy for the production of the hydroxyl radicals from the oxidant. Hydroxyl radicals can thus be generated, for example using ozone oxidation or Fenton oxidation (using $H_2O_2$ and iron as a catalyst) or photocatalytic oxidation (using a catalyst such as W, Ti, or Zn).

In other embodiments, wet oxidation, where oxygen is used as the oxidizer in superheated water under pressure, can also be used in the oxidation reactors 110, 140. Ultrasonic oxidation can also be used, where hydroxyl radicals are produced by ultrasonic waves that cause the formation of cavitation bubbles. These bubbles subsequently implode, generating high temperatures and pressures that decompose water and form hydroxyl radicals. Supercritical water oxidation, where an oxidizer is dissolved in water above the critical point, can also generate radicals that oxidize compounds in the water stream.

The feed to the ABA module can be raw water or treated water, depending on the location of the ABA module within the water treatment/purification system. The total organic carbon (TOC) content of the feed is contemplated to be greater than 0.1 parts per million (ppm), and for example may be from about 0.3 ppm to about 0.5 ppm. The maximum contemplated TOC is 1 ppm.

In the first oxidation reactor 110, organic content is oxidized and broken down into smaller molecules. The aqueous output 118 of the first oxidation reactor 110 is used as a feed to the biological reactor 120. Off-gassing 116 may also occur and be considered an output of the first oxidation reactor 110. The oxidation reactor may have any desired shape, for example a tank or a long winding pipe, to fit in the space available.

In the biological reactor 120, biological organisms are used to further reduce the total organic content (TOC) of the water stream, which was further broken down by the first oxidation reactor 110. Such biological organisms may include microorganisms such as bacteria, plants, and/or small animals that consume carbon, removing the carbon from the water stream and thus purifying the water stream. Small polycyclic aromatic compounds, esters, phenols, and nitrogen-containing compounds can also be decomposed and consumed in the biological reactor. For example, this may occur due to enzymatic reactions produced by the biological organisms.

As one example, the biological reactor 120 may use an activated sludge process. Aerobic microorganisms are present in the biological reactor, and air 122 is injected into the biological reactor (if needed, depending on the structure of the biological reactor). The aerobic microorganisms digest organic matter present in the water stream and also clump together as a floc which can settle out. The aerobic microorganisms may be bacteria and/or protozoa. The settler 130 receives a feed 124 from the biological reactor 120. The settler 130, which should be considered to be part of the bioremediation step, is used to permit the floc and other solids to settle out, separating solids from the treated water. The settled material is removed as wash-out 132, and the water is outputted from the settler 130 to the second oxidation reactor 140 via line 134.

As another example, the biological reactor 120 may take the form of a membrane bioreactor. A selective membrane is used, for example within the biological reactor 120 or within the settler 130, to permit water to flow through the membrane while retaining the biological matter on the other side of the membrane.

If desired, biological adsorbents may be included within the biological reactor 120. These adsorbents bind to various molecules within the water stream, removing them. Non-limiting examples of biological adsorbents may include activated carbon, chitosan, eggshells, bones, and/or fungi.

The biological reactor may alternatively include one or more filters which can serve as a support or a substrate for bacteria to attach to and grow up. The bacteria also consume carbon within the water stream. It is expressly noted that algae are not desired in the biological reactor, and chlorine may be used to control their presence and/or remove other unwanted organisms.

The second oxidation reactor 140 receives the output from the biological reactor 120 or the settler 130. Like the first oxidation reactor 110, the inputs to the second oxidation reactor 140 also include an oxidant 142, along with a feed 134 from the biological reactor 120 or the settler 130, and an ultraviolet light source 144. In contrast to the first oxidation reactor 110 whose main function is to break bonds for easier digestion in the biological reactor, the function of the second oxidation reactor 140 is to convert remaining carbon into carbon dioxide, which can be removed from the water stream. The overall use of the ABA module also breaks down larger molecules into smaller molecules, which may enhance their removal by the rest of the water treatment and purification system as well. The second oxidation reactor 140 also includes an off-gas 146 and an output 150 from which the treated water flows downstream to a subsequent water treatment step.

It is noted that the biological reactor 120 serves the function of providing an environment in which biological organisms can grow and consume carbon, while the settler 130 serves the function of clarifying the treated water. Their structures may vary as desired to serve these functions, and they do not have to be two physically separate structures—they can be in a single integrated structure. Put another way, the settler 130 is optional. The biological reactor does not require exposure to sunlight, and thus can be placed indoors or outdoors.

It should be noted that the biological reactor is not immediately usable at 100% capacity. Rather, the treatment capacity of the biological reactor needs to be slowly built up as biological organisms reproduce and colonize the reactor. Over time, the treatment capacity of the biological reactor will increase as organisms best able to consume the materials in the water stream out-compete other organisms. Thus, the amount of raw water being filtered through the biological reactor should be gradually increased over time. In addition, as the chemistry of the incoming water stream changes, the biological contents of the biological reactor may change as well. In addition, the biology therein will need to be periodically pruned to remove overgrowth and maintain acceptable treatment capacity (for example through increasing the wash-out 132).

The size of the individual reactors within the ABA module may depend on desired treatment capacity (i.e. cubic meters per day) and desired hydraulic retention time/residence time. A hydraulic retention time (HRT) of about 1 hour to about 6 hours within the biological reactor 120 is desirable, whereas the HRT within the two oxidation reactors 110, 140 may only be from about 5 minutes to about 1 hour.

The amount of oxidant that needs to be provided to each oxidation reactor 110, 140 will also vary according to the desired treatment capacity, hydraulic retention time, and the incoming total organic content (TOC). With respect to the first oxidation reactor 110, because it is only desired to break bonds, the necessary dosage of oxidant is lower than that for the second oxidation reactor 140. It is contemplated, for example, that the maximum dosage for ozone in the first oxidation reactor 110 is about 10 micrograms per liter per hour.

The embodiment of the ABA module 100 illustrated in FIG. 1B includes only one oxidation reactor 110 instead of two oxidation reactors as in FIG. 1A. Here, a recycle loop 138 flows from the biological reactor 120 or settler 130 back to the oxidation reactor 110, which otherwise operates as previously described. An output 150 to a subsequent water treatment step is taken from the biological reactor 120 or settler 130. The embodiment of FIG. 1A may be more suitable for continuous operation, whereas the embodiment of FIG. 1B may be more suitable for batch-mode operation.

The ABA module can be incorporated into a water treatment system that includes other units or components for different kinds of treatment of the water to obtain the desired ultrapure water. Very generally, the other units or components of the water treatment system will include one or more of the following: a raw water tank (RWT), a multi-media filter (MMF), an activated carbon filter (ACF), a 2-bed 3-tower (2B3T) unit, a reverse osmosis (RO) unit, an ultraviolet (UV) unit, a stratified bed polisher (SBP) unit, a membrane degasification (MDG) unit, a cautionary polish (CP) unit, and an ultrafiltration (UF) unit. Not illustrated herein are conventional pipes, valves, gauges, sensors, etc. which are commonly present as well. A description of these units/components is provided first, and then the entire water treatment system is described.

The raw water tank (RWT) is a vessel in which raw water is contained. The raw water generally has a TOC content of greater than 0.1 ppm to a maximum of 1.0 ppm. For comparative purposes, the final ultrapure water (UPW) produced at the end of the water treatment system and provided at the point of use desirably has a total TOC content of less than 1.0 part per billion (ppb), and even more desirably less than 0.5 ppb or less than 0.3 ppb. The UPW may also have a resistivity from 18.0 to 18.25 Mohm-cm, and dissolved oxygen content of less than 10 ppb.

A multi-media filter (MMF) is a filter that is typically formed by at least three layers of different media, which are layered by size and density. Larger and less-dense particles are arranged on top, while smaller and denser particles are arranged at the bottom. Common media include anthracite coal (less dense), sand, and garnet (most dense), with a supporting layer of gravel at the bottom. The media form a bed within a tank. Water is fed into the top of the tank, and driven by pressure through the layers to the bottom of the tank, where the treated water is removed. The layering encourages larger contaminants to be trapped near the top, and smaller contaminants to be trapped near the bottom, so the entire depth of the bed can be used for filtering.

The MMF is used to reduce the level of suspended solids (turbidity) in the water stream. Such solids may include, for example, small rocks, soil/silt, organic matter, and plants/microorganisms. An MMF can remove large particles down to particles having an average diameter of about 10 micrometers (μm) to about 25 μm.

Figure 2:
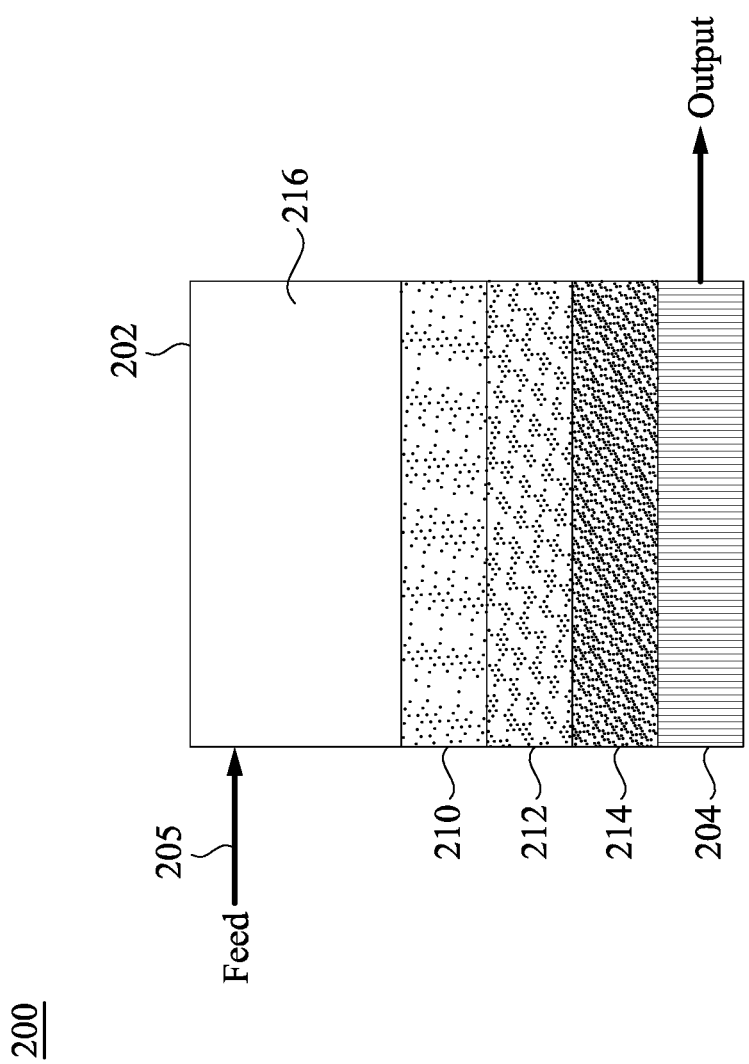
FIG. 2 is a schematic diagram of a multi-media filter (MMF).

FIG. 2 is a schematic illustration of a multi-media filter 200. As illustrated here, the tank 202 contains a supporting layer 204 at the bottom of the tank. Three different layers of media are illustrated here, with the largest-sized particles forming the top layer 210, intermediate-sized particles forming the middle layer 212, and the smallest-sized particles forming the bottom layer 214. A feed stream 205 enters at the top of the tank, where a headspace 216 over the layered media is present. After the feed stream passes through the layered media under pressure, an output stream 220 exits at the bottom of the tank.

An activated carbon filter (ACF) is similar to a multi-media filter, but uses granular activated carbon as the filter medium. Material containing high amounts of carbon (such as coconut shells) are activated by heat in the absence of oxygen to form pores in the carbon. Again, water is driven through the activated carbon by pressure, and contaminants are removed through adsorption. An ACF is useful for trapping ions, chlorine, organic molecules, and other oxidants present in the water stream.

Figure 3:
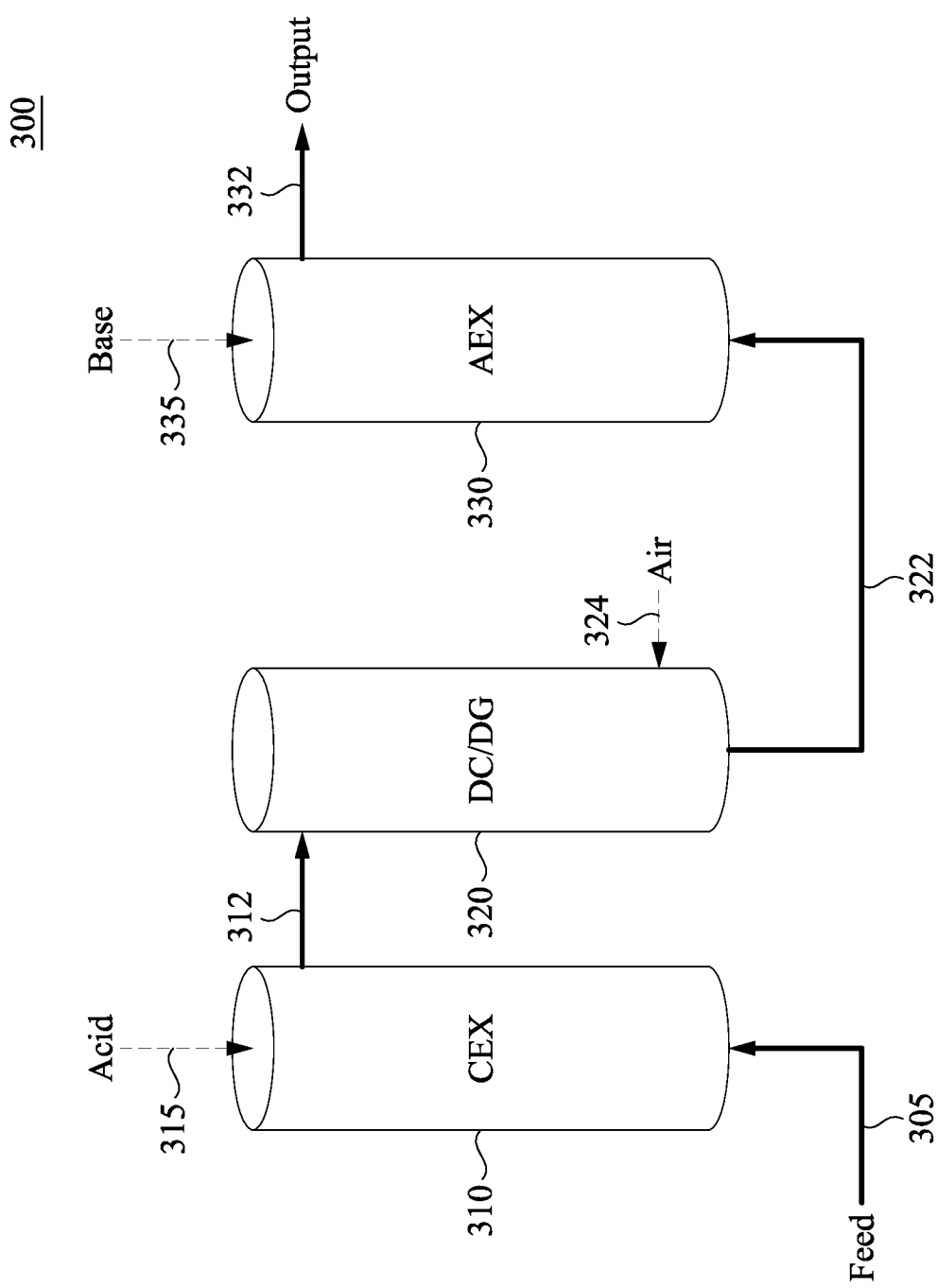
FIG. 3 is a schematic diagram of a 2-bed 3-tower (2B3T) unit.

A 2-bed 3-tower (2B3T) unit is used to remove cations and anions, or put another ways to demineralize the water stream. FIG. 3 is a schematic illustration of a 2B3T unit. The unit 300 includes a cation exchanger tower 310 (CEX), which receives a feed stream 305. The cation exchanger tower includes a bed containing a cation-exchange resin that removes cations from the water stream.

The output 312 from the cation exchanger tower is used as the feed to a decarbonation tower or degasifier 320 (DC/DG), where carbon dioxide is removed from the water stream. Within the decarbonation tower, the water stream is broken up into small droplets. An air stream 324 blows past the droplets, transferring gas out of the droplets and into the air stream. The decarbonated/degassed droplets are collected at the bottom of the tower.

The output 322 from the decarbonation tower 320 is used as the feed to an anion exchanger tower 330 (AEX). The anion exchanger tower includes a bed containing an anion-exchange resin that removes anions from the water stream. The output 332 from the anion exchanger tower is fed to a subsequent downstream processing unit. As further illustrated, the resin in the cation exchanger tower 310 can be regenerated by washing with an acid 315, and the resin in the anion exchanger tower 330 can be regenerated by washing with a base 335.

As previously mentioned, a reverse osmosis (RO) unit operates by applying pressure on one side of a partially permeable membrane to push water through the membrane and ideally retain any solute on the pressurized side. The RO unit can remove particles having a size as small as 26 angstroms, depending on the selectivity of the partially permeable membrane.

In an ultraviolet (UV) unit, the water stream is exposed to UV light, typically at a wavelength of about 254 nm. This destroys viruses and/or bacteria that may be present in the water stream. UV exposure also breaks covalent bonds in organic matter, which aids in further treatment to reduce TOC content.

A stratified bed polisher (SBP) unit is used to remove metals and ions from the water stream, as well as other remaining suspended solids or organic content. The structure of an SBP unit is similar to that of a MMF, but with multiple layers of resin that act as adsorbents that act similarly to an ACF.

A membrane degasification (MDG) unit is used to remove dissolved gases from the water stream. For example, dissolved oxygen can react with and oxidize metals used in the integrated circuits on a semiconductor wafer, creating defects. As another example, dissolved carbon dioxide (and other ions) can increase the electrical conductivity of the water, which can cause short circuits and other defects in the integrated circuits. Such gases are removed by replacement with nitrogen ($N_2$). In the MDG unit, for example, pure nitrogen gas is brought into contact with the water stream across a hydrophobic membrane. Gas can pass through the membrane, but water cannot. This adjusts gas concentrations across the membrane, decreasing the $O_2$ concentration in the water stream and increasing the $N_2$ concentration in the water stream.

A cautionary polish (CP) unit is similar to the SBP unit, and is also used to further remove metals and ions present in the water stream. Upstream processes, such as the UV unit, may create new ions, and the CP unit removes these ions from the water stream. The CP unit may also be considered a second SBP unit, or as a secondary polishing step or a final polishing step.

An ultrafiltration (UF) unit is used to filter out particles and molecules of very small size, as small as 2 nanometers (nm). The UF unit is typically the final filtration step to obtain ultrapure water (UPW) which is sent then to a point of use (POU).

Continuing, FIGS. 4A-34 are five different embodiments of water treatment systems 400 that include an ABA module, in accordance with the present disclosure.

Referring first to FIG. 4A, raw water starts in the raw water tank RWT 405, which feeds the ABA module 100. The output of the ABA module feeds an MMF 200, which feeds an ACF 410. The output from the ACF 410 enters the 2B3T unit 300. Continuing, the output of the 2B3T unit feeds an RO unit 415, which feeds a first UV unit 420. The output from the first UV unit then feeds the SBP unit 425, which feeds a first MDG unit 430. The output from the first MDG unit feeds a second UV unit 435. A CP unit 440 receives the output from the second UV unit, and removes ions which may have been formed in the water stream by the second UV unit. The CP unit then feeds a second MDG unit 445, which feeds a UF unit 450, which provides ultrapure water (UPW) to the point of use POU 455. The RWT, ABA module, MMF, ACF, 2B3T unit, RO unit, first UV unit, SBP unit, first MDG unit, second UV unit, CP unit, second MDG unit, and the UF unit are fluidly connected to each other in the sequence described. In FIG. 4A, the ABA module 100 is added at the front of the water treatment system directly downstream of the RWT 405, which can avoid the need for rearranging the other units of the water treatment system.

Referring next to FIG. 4B, the other units of the water treatment system are fluidly connected to each other in the same order, but the ABA module is moved to be located directly downstream of the ACF 410 and directly upstream of the 2B3T unit 300. Any carbon which might escape from the ACF 410 can thus be captured in the ABA module.

Figure 4C:
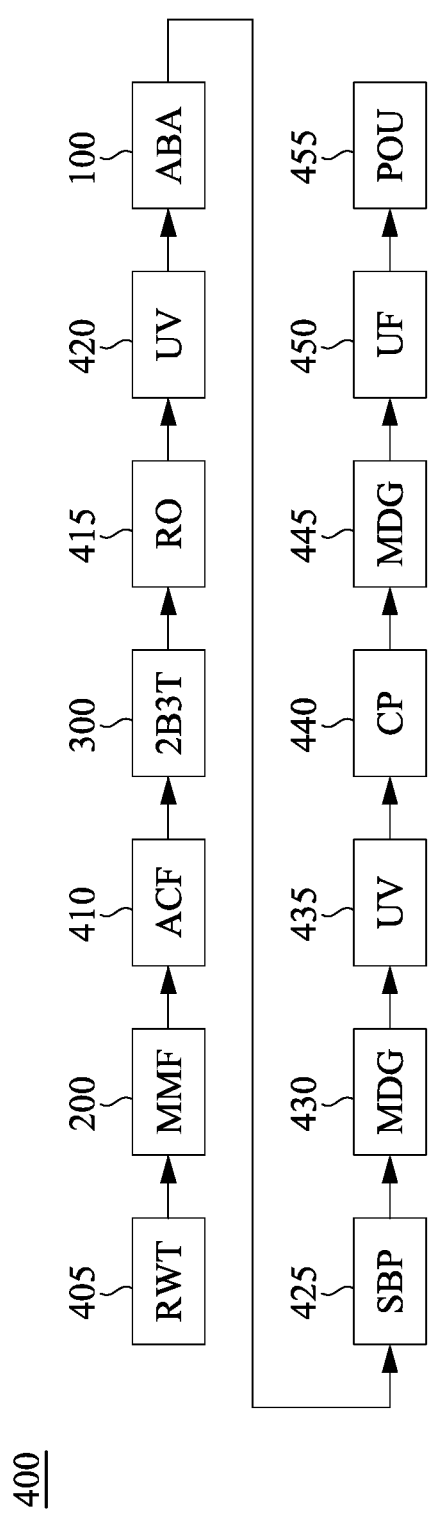
FIG. 4C is a third water treatment system, in accordance with some embodiments.

In the embodiment of FIG. 4C, the ABA module is moved to be located directly downstream of the first UV unit 420 and directly upstream of the SBP unit 425. In the embodiment illustrated in FIG. 4D, the ABA module is now located directly downstream of the second UV unit 435 and directly upstream of the CP unit 440. These locations downstream of a UV unit may take advantage of any oxidizing radicals generated in the UV unit to permit their use in the first oxidation reactor 110 of the ABA module.

Figure 4D:
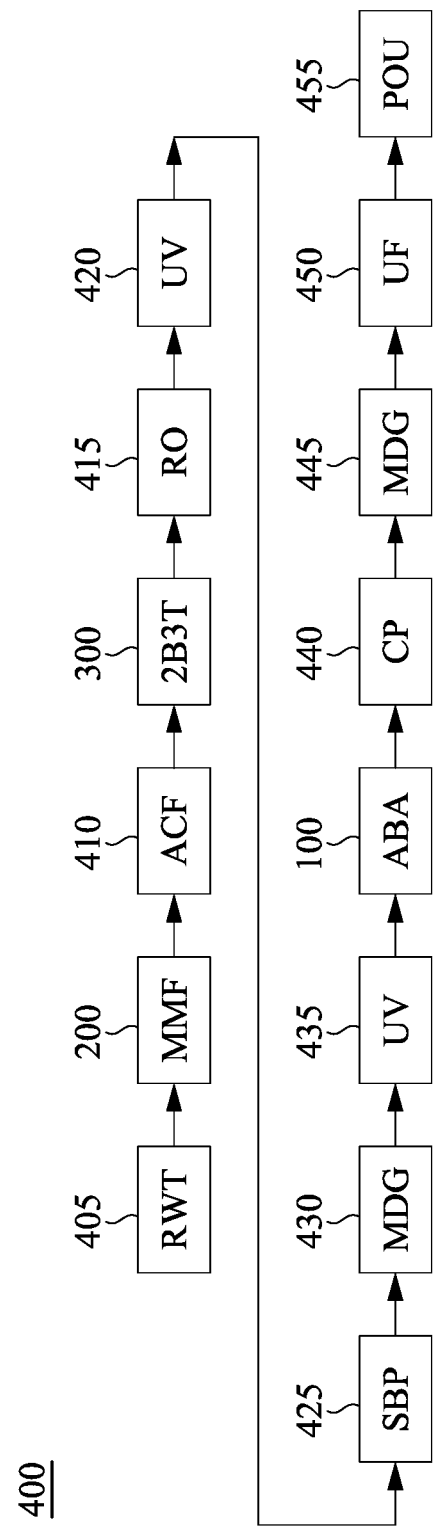
FIG. 4D is a fourth water treatment system, in accordance with some embodiments.

Considering FIGS. 4B-4D together, the output of the ABA module may contain elevated levels of ozone, an oxidant. High oxidant levels are not desirable as the input for some operations, and so in particular embodiments, the ABA module is directly upstream of a resin adsorption unit which is able to capture the ozone. Such resin adsorption units include a 2B3T unit, an SBP unit, or a CP unit, which can be used to remove those oxidants and/or neutralize any ions still present in the water stream.

While the ABA treatment step is only illustrated once in each water treatment process in FIGS. 4A-4D, it is also contemplated that if desired, the ABA treatment step could also be performed multiple times in a water treatment process, for example by inserting the ABA treatment step in any of the locations illustrated in these four figures. In addition, it is also noted that the second UV unit 435, CP unit 440, and second MDG unit 445 duplicate the functions of the first UV unit 420, the SBP unit 425, and the first MDG unit 430. In some other embodiments, it is contemplated that the second UV unit 435, CP unit 440, and second MDG unit 445 are optional.

Figure 4E:
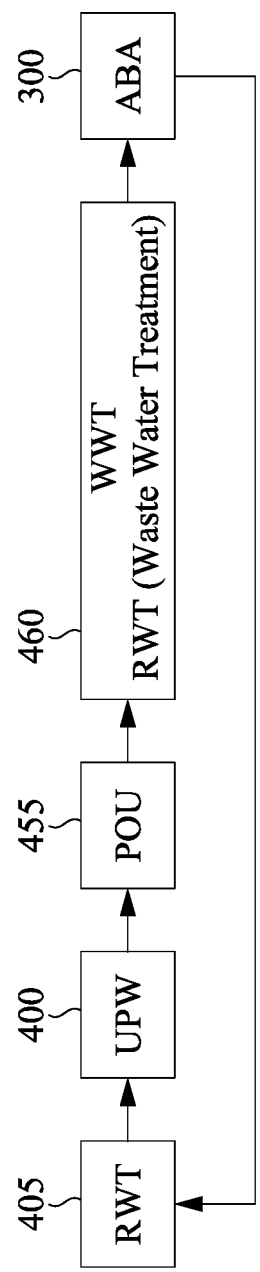
FIG. 4E is a fifth water treatment system, in accordance with some embodiments.

Finally, referring to FIG. 4E, in some embodiments, UPW is produced by a water treatment system 400 and used at the point of use POU 455. Depending on the application, the waste water may contain high levels of anions such as fluoride or phosphate or chloride or boron, organic compounds or nitrogenous compounds, heavy metals, perfluorinated compounds, or dissolved silica. A waste water treatment (WWT) unit 460 can be used to treat the waste water, for example to capture the heavy metals. The effluent from the WWT unit can then be used as the feed to the ABA module, which can be used to decompose other large molecules and compounds still remaining in the waste water. The ABA module is directly upstream of the RWT 405, and feeds its output to the RWT.

Figure 5:
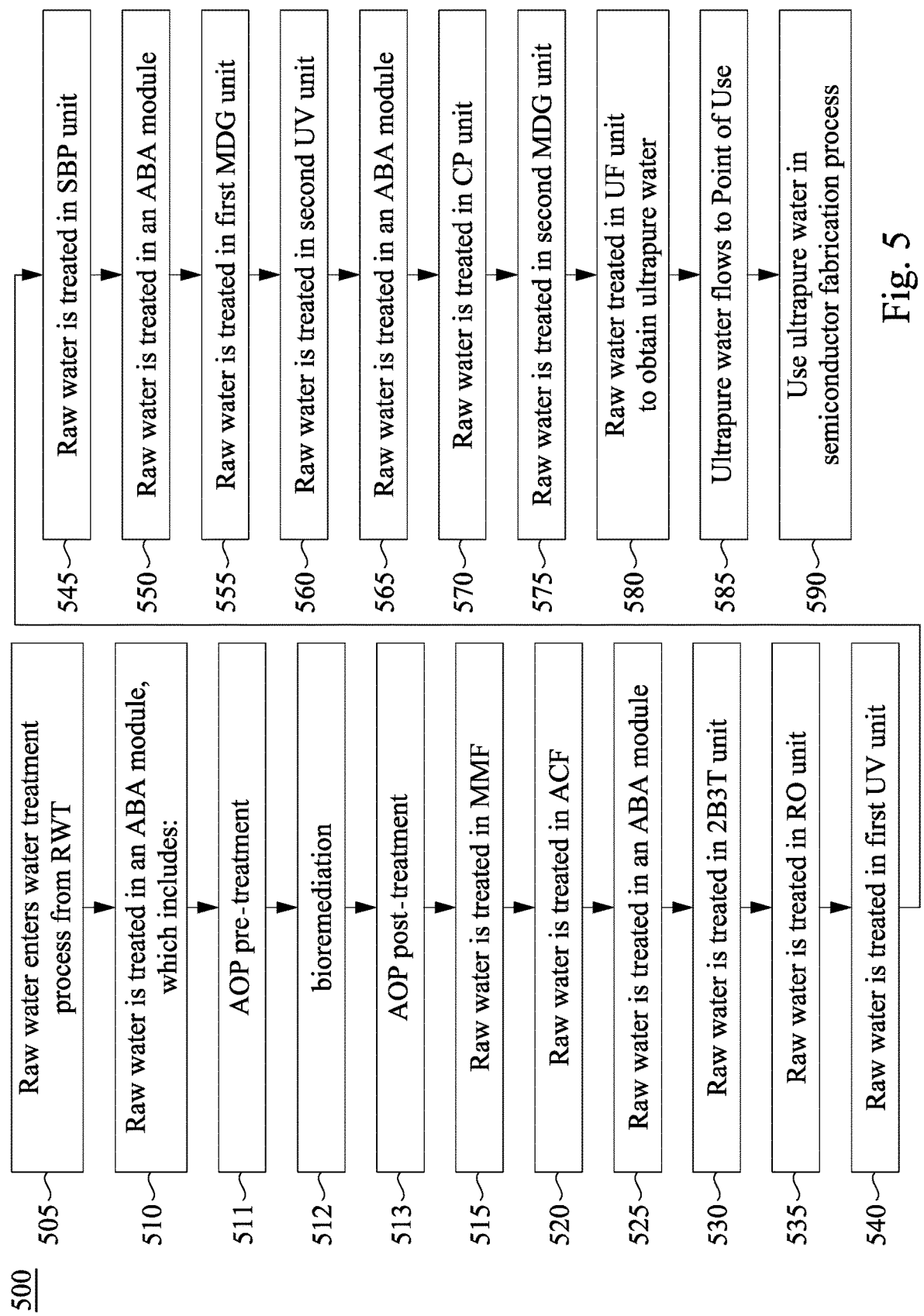
FIG. 5 is a flowchart illustrating an example method for producing ultrapure water (UPW), in accordance with some embodiments.

FIG. 5 is a flowchart illustrating methods 500 for producing ultrapure water (UPW), in accordance with some embodiments of the present disclosure. Briefly, raw water is treated in a water treatment process that passes through several different units of a water treatment system. As previously mentioned, the term "raw water" and "treated water" may be used interchangeably to refer to water flowing into a water treatment unit, regardless of whether the water has already pass through a prior water treatment unit. The method steps of FIG. 5 are illustrated in FIGS. 4A-4D.

Initially, in step 505, the raw water enters the water treatment process from the raw water tank RWT 405. Next, in step 510, raw water is treated in an ABA module. Within the ABA module, the raw water undergoes an advanced oxidation process (AOP) pre-treatment step 511, which feeds a bioremediation step 512, which feeds an AOP post-treatment step 513. Referring back to FIGS. 4A-4D, this step may occur in at least four different locations, which is also indicated in FIG. 5 as steps 525, 550, and 565. Treatment in an ABA module occurs at least once, and may occur multiple times if desired.

In step 515, the raw water flows through and is treated in a MMF 200. In step 520, the raw water flows through and is treated in an ACF 410. In step 530, the raw water flows through and is treated in a 2B3T unit 300. In step 535, the raw water flows through and is treated in an RO unit 415. In step 540, the raw water flows through and is treated in a first UV unit 420. In step 545, the raw water flows through and is treated in an SBP unit 425. In step 555, the raw water flows through and is treated in a first MDG unit 430. In step 560, the raw water flows through and is treated in a second UV unit 435. In step 570, the raw water flows through and is treated in a CP unit 440. In step 575, the raw water flows through and is treated in a second MDG unit 445. In step 580, the raw water flows through and is treated in a UF unit 450, resulting in the desired ultrapure water (UPW). In step 585, the UPW flows to the point of use POU 455. In step 590, the UPW is then used in a semiconductor fabrication process.

A semiconductor fabrication or manufacturing process broadly refers to any process that occurs within a semiconductor fabrication plant which changes the structure of the semiconductor wafer substrate or the integrated circuits thereon, or which is performed on a tool that contacts the semiconductor wafer substrate. For example, UPW can be applied to the semiconductor wafer substrate to rinse or clean the wafer, and remove materials from the surface of the wafer. UPW can be used to form slurries or various aqueous solutions, which are then used in processes such as chemical-mechanical planarization (CMP) or wet etching of the wafer substrate. UPW is used as the liquid medium for an immersion lithography tool. UPW is also used to clean various tools, such as a CMP tool, a dry etch or wet etch tool, a physical vapor deposition (PVD) or chemical vapor deposition (CVD) or atomic layer deposition (ALD) or epitaxial growth or electrochemical deposition tool, a mask coating tool, a mask cleaning tool, a wafer metrology or inspection tool, an ion implantation tool, or an annealing tool.

Figure 6:
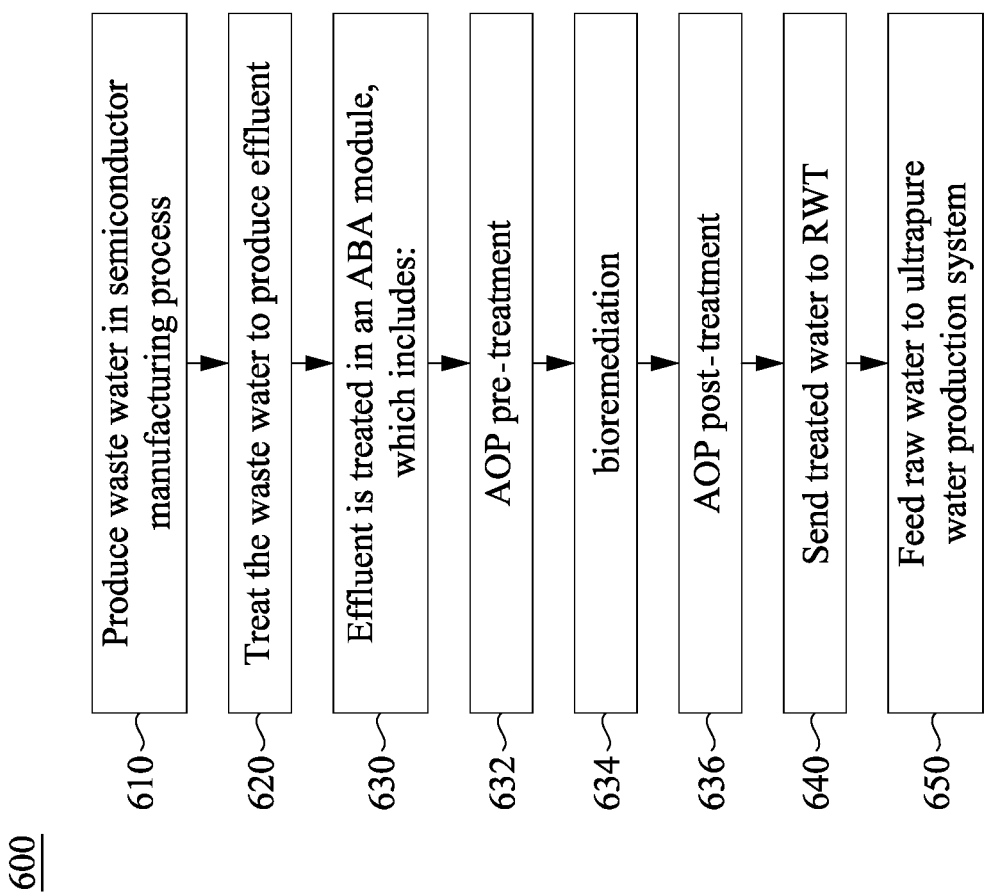
FIG. 6 is a flowchart illustrating an example method for reclaiming waste water from a semiconductor manufacturing process, in accordance with some embodiments.

FIG. 6 is a flowchart illustrating methods 600 for reclaiming waste water from a semiconductor manufacturing process, in accordance with some embodiments of the present disclosure. These method steps are illustrated in FIG. 4E.

First, in step 610, waste water is produced in a semiconductor manufacturing process. This occurs at the POU 455 in FIG. 4E. Examples of such processes are provided above.

Next, in step 620, the waste water is treated to produce an effluent. This occurs at WWT 460 in FIG. 4E. Such treatment may include, for example, capturing heavy metals or polymers that may be in the waste water. The resulting effluent desirably does not contain contaminants which may poison or adversely affect the ABA module.

Next, in step 630, the effluent is treated in the ABA module 100. Within the ABA module, the effluent undergoes an advanced oxidation process (AOP) pre-treatment step 632, which feeds a bioremediation step 634, which feeds an AOP post-treatment step 363. Then, in step 640, the treated effluent is sent to a raw water tank RWT 405. Then, in step 650, the raw water is used as feed to an ultrapure water production system, which occurs at UPW 400 in FIG. 4E. The ultrapure water production system of FIG. 4E may correspond to any of the systems described in FIGS. 4A-4D, with or without the presence of the ABA module therein.

Figure 7:
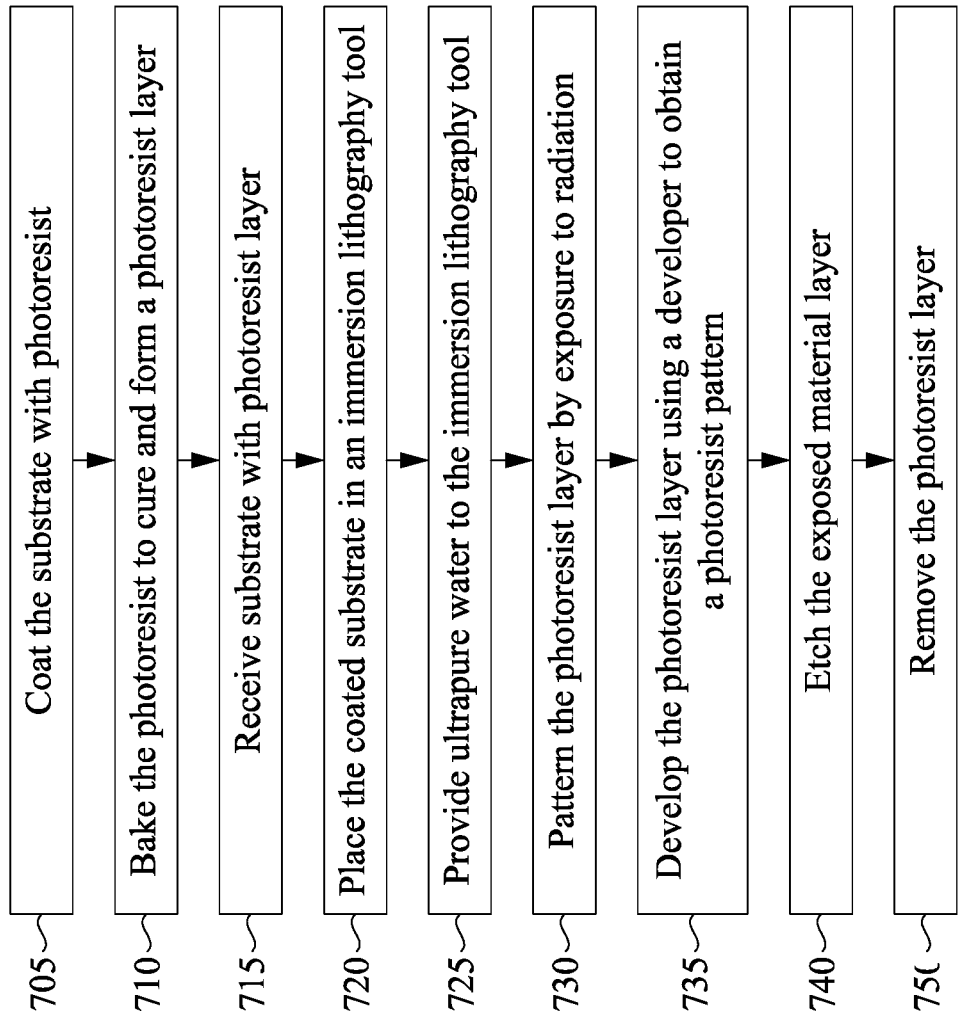
FIG. 7 is a flowchart illustrating an example lithographic process, in accordance with some embodiments of the present disclosure.

FIG. 7 is a flowchart illustrating a lithographic process 700, in accordance with some embodiments of the present disclosure.

In step 705, photoresist is coated onto a substrate. The substrate may be any type of material layer in which a pattern is desired to be formed. The coating may be done, for example, by spin coating, or by spraying, roller coating, dip coating, or extrusion coating. Typically, in spin coating, the substrate is placed on a rotating platen, which may include a vacuum chuck that holds the substrate in plate. The photoresist is then applied to the center of the substrate. The speed of the rotating platen is then increased to spread the photoresist evenly from the center of the substrate to the perimeter of the substrate. The rotating speed of the platen is then fixed, which can control the thickness of the final photoresist layer.

In step 710, the photoresist is baked or cured to remove the solvent and harden the photoresist layer. In some particular embodiments, the baking occurs at a temperature of about 90° C. to about 110° C. The baking can be performed using a hot plate or oven, or similar equipment. As a result, the photoresist layer is formed on the substrate.

In step 715, the substrate having photoresist thereon is received.

In step 720, the coated substrate is placed within an immersion lithography tool.

In step 725, ultrapure water (UPW) is provided to an immersion lithography tool. The UPW is produced by a water treatment system which includes an ABA module as described herein. The UPW is used to form a liquid layer between the final lens element of the immersion lithography tool and the photoresist. The UPW has a refractive index greater than one, improving the resolution of the immersion lithography tool.

In step 730, the photoresist layer is patterned via exposure to radiation. The radiation passes through the liquid layer formed by the UPW. The radiation may be any light wavelength which carries a desired mask pattern. In particular embodiments, DUV light with a wavelength of 193 nm or 248 nm or EUV light having a wavelength of about 13.5 nm is used. This results in some portions of the photoresist layer being exposed to radiation, and some portions of the photoresist not being exposed to radiation.

In step 735, the photoresist layer is developed using a developer. The developer may be an aqueous solution or an organic solution. The soluble portions of the photoresist layer are dissolved and washed away during the development step, leaving behind a photoresist pattern. One example of a common developer is aqueous tetramethylammonium hydroxide (TMAH). Generally, any suitable developer may be used.

Continuing, portions of the material layer below the photoresist pattern are now exposed. In step 740, the material layer is etched, causing the exposed portions of the material layer to be removed, thus transferring the photoresist pattern to the material layer. The etching can be performed by dry etching or wet etching.

Besides etching of the material layer, other process steps may alternatively be carried out. For example, ions could be implanted into the exposed material layer instead, or a different material could subsequently be deposited upon the material layer.

Finally, in step 750, the photoresist layer is removed. This can be done, for example, using various solvents such as N-methyl-pyrrolidone (NMP) or alkaline media or other strippers at elevated temperatures, or by dry etching using oxygen plasma.

The inclusion of the ABA module in the water treatment system provides the benefit of being able to maintain the desired TOC content in the final ultrapure water (desirably less than 0.3 ppb) while permitting greater variation in the TOC content of the incoming raw water, or put another way UPW production can remain within specification and is more stable even though the input is more variable. In addition, the concentration of other contaminants in the UPW can be decreased by the additional AOP and biological treatment steps provided in the ABA module. In particular, small molecules which were previously not decomposed are further decomposed and removed. The ABA module is applied to raw water with very low concentrations of contaminants, and their concentration is reduced even further. The biological reactor of the ABA module is also used to generate different types of catalysts (i.e. enzymes) for decomposition of molecules, which cannot be generated by chemical systems.

Some embodiments of the present disclosure thus relate to methods for producing ultrapure water (UPW). Raw water is treated in a water treatment process to obtain the ultrapure water. The water treatment process includes an ABA module that performs: an advanced oxidation process (AOP) pre-treatment step that feeds a bioremediation step; and an advanced oxidation process post-treatment step that is fed by the bioremediation step.

Also disclosed are lithographic processes. A substrate having photoresist thereon is received. Ultrapure water is provided to an immersion lithography tool. The photoresist is then exposed to radiation using the immersion lithography tool. Radiation passes through the ultrapure water, which is located between the final lens element of the immersion lithography tool and the photoresist, to form a pattern in the photoresist. The photoresist is then developed, leaving a patterned photoresist layer on the substrate. The ultrapure water is produced by a water treatment system which includes an ABA module. The ABA module comprises a first oxidation reactor for performing an advanced oxidation process (AOP) treatment, and a biological reactor that receives a feed from the first oxidation reactor.

Other embodiments of the present disclosure relate to water treatment systems for producing ultrapure water (UPW). The systems comprise an ABA module that comprises a first oxidation reactor, a biological reactor, and an optional settler. The first oxidation reactor performs an advanced oxidation process (AOP) treatment. The biological reactor receives a feed from the first oxidation reactor. The optional settler receives a feed from the biological reactor.

Other embodiments of the present disclosure relate to methods for reclaiming waste water from a semiconductor manufacturing process. The waste water is treated to produce an effluent. The effluent is treated in an ABA module. The ABA module performs an advanced oxidation process (AOP) pre-treatment step that feeds a bioremediation step, and an advanced oxidation process post-treatment step that is fed by the bioremediation step. The treated effluent is then sent from the ABA module to a raw water tank.

The methods and systems of the present disclosure are further illustrated in the following non-limiting working example, it being understood that the example is intended to be illustrative only and that the disclosure is not intended to be limited to the materials, conditions, process parameters and the like recited herein.

EXAMPLE

Two experiments were run in which two AOP treatments were performed on raw water. The TOC and conductivity were measured. In the first experiment, ozone and UV were used for the AOP. In the second experiment, ozone and bromate (OBr—) were used for the AOP, without UV exposure. The results for the first experiment are shown in Table A, and the results for the second experiment are shown in Table B.

TABLE A

| ozone and UV | | | | |
|---|---|---|---|---|
| | Raw water | After 1st AOP | After 2nd AOP | Desired Value |
| Conductivity (µS/cm) | 3790 | 10 | 5 | <50 |
| TOC (ppb) | 3963 | 48 | 22 | <50 |

TABLE B

| ozone and OBr— | | | | |
|---|---|---|---|---|
| | Raw water | After 1st AOP | After 2nd AOP | Desired Value |
| Conductivity (µS/cm) | 3130 | 1.2 | 1 | <50 |
| TOC (ppb) | 43000 | 30 | 20 | <50 |

These results showed that the use of AOP significantly reduced the TOC and the conductivity of the water.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for producing ultrapure water (UPW) for use in semiconductor fabrication, comprising:
    treating raw water in a water treatment process to obtain the ultrapure water, wherein the water treatment process includes:
    an ABA module that performs:
        an advanced oxidation process (AOP) pre-treatment step that feeds a bioremediation step; and
        an advanced oxidation process post-treatment step that is fed by the bioremediation step,
        wherein the ABA module is directly upstream of a resin adsorption unit;
    a membrane degasification (MDG) unit downstream of the resin adsorption unit; and
    an ultrafiltration (UF) unit downstream of the MDG unit;
    wherein the raw water has a total organic carbon (TOC) content of greater than 0.1 ppm, and the resulting ultrapure water has a total organic carbon (TOC) content of less than 1.0 ppb.

2. The method of claim 1, wherein the AOP pre-treatment step or the AOP post-treatment step is performed in an oxidation reactor which includes an ozone ($O_3$) feed and ultraviolet light.

3. The method of claim 2, wherein the oxidation reactor also includes a hydrogen peroxide ($H_2O_2$) feed.

4. The method of claim 1, wherein the oxidation reactor is sized for a hydraulic retention time of about 5 minutes to about 1 hour.

5. The method of claim 1, wherein the bioremediation step is performed in a biological reactor and a settler.

6. The method of claim 5, wherein the biological reactor is sized for a hydraulic retention time of about 1 hour to about 6 hours.

7. The method of claim 1, wherein the ABA module is directly downstream from a raw water tank (RWT), or an activated carbon filter (ACF), or an ultraviolet (UV) unit.

8. The method of claim 1, wherein the resin adsorption unit is a 2-bed 3-tower (2B3T) unit, a stratified bed polisher (SBP) unit, or a cautionary polish (CP) unit.

9. The method of claim 1, wherein the water treatment process further comprises, located upstream of the ABA module:
    a multi-media filter (MMF); and
    an activated carbon filter (ACF).

10. A method for reclaiming waste water from a semiconductor manufacturing process, comprising:
    treating the waste water to produce an effluent;
    treating the effluent in an ABA module that performs:
        an advanced oxidation process (AOP) pre-treatment step that feeds a bioremediation step; and
        an advanced oxidation process post-treatment step that is fed by the bioremediation step; and
    sending the treated effluent to a raw water tank;
    wherein the ABA module comprises a biological reactor that receives a feed from a first oxidation reactor, a settler that receives a feed from the biological reactor, and a recycle loop from the settler to the first oxidation reactor, and an output from the biological reactor or the settler to a subsequent water treatment step.

11. The method of claim 10, wherein the raw water tank provides a feed to an ultrapure water production system.

12. A method for producing ultrapure water (UPW) for use in semiconductor fabrication, comprising:
    treating raw water in a water treatment system which includes:
    a multi-media filter (MMF);
    an activated carbon filter (ACF) downstream of the MMF;
    an ABA module downstream of the ACF that comprises:
        a first oxidation reactor for performing an advanced oxidation process (AOP) treatment; and
        a biological reactor that receives a feed from the first oxidation reactor for performing bioremediation; and
    a resin adsorption unit directly downstream of the ABA module;
    wherein the raw water has a total organic carbon (TOC) content of greater than 0.1 ppm, and the resulting ultrapure water has a total organic carbon (TOC) content of less than 1.0 ppb.

13. The method of claim 12, wherein the ABA module further comprises a settler that receives a feed from the biological reactor.

14. The method of claim 13, further comprising a recycle loop from the settler to the first oxidation reactor, or further comprising a second oxidation reactor for performing an (AOP) treatment which receives a feed from the settler.

15. The method of claim 12, further comprising a recycle loop from the biological reactor to the first oxidation reactor, or further comprising a second oxidation reactor for performing an (AOP) treatment which receives a feed from the biological reactor.

16. The method of claim 12, wherein the resin adsorption unit is a 2-bed 3-tower (2B3T) unit, a stratified bed polisher (SBP) unit, or a cautionary polish (CP) unit.

17. The method of claim 12, wherein the resin adsorption unit is a 2-bed 3-tower (2B3T) unit, and the water treatment system further comprises, in sequence:

a reverse osmosis (RO) unit downstream of the 2B3T unit;
a first ultraviolet (UV) unit;
a stratified bed polisher (SBP) unit;
a first membrane degasification (MDG) unit; and
an ultrafiltration (UF) unit.

18. The method of claim 17, wherein the water treatment system further comprises, in sequence, a second ultraviolet (UV) unit, a cautionary polish (CP) unit, and a second membrane degasification (MDG) unit;
   wherein the second ultraviolet (UV) unit is directly downstream of the first MDG unit and the second MDG unit is directly upstream of the UF unit.

19. The method of claim 12, wherein the resin adsorption unit is a stratified bed polisher (SBP) unit, and the water treatment system further comprises:
   a 2-bed 3-tower (2B3T) unit downstream of the ACF;
   a first reverse osmosis (RO) unit downstream of the 2B3T unit;
   a first ultraviolet (UV) unit downstream of the first RO unit;
   a first membrane degasification (MDG) unit downstream of the SBP unit;
   a second ultraviolet (UV) unit;
   a cautionary polish (CP) unit;
   a second membrane degasification (MDG) unit; and
   an ultrafiltration (UF) unit.

20. The method of claim 12, wherein the resin adsorption unit is a cautionary polish (CP) unit, and the water treatment system further comprises:
   a 2-bed 3-tower (2B3T) unit downstream of the ACF;
   a first reverse osmosis (RO) unit downstream of the 2B3T unit;
   a first ultraviolet (UV) unit downstream of the first RO unit;
   a stratified bed polisher (SBP) unit downstream of the first UV unit;
   a first membrane degasification (MDG) unit downstream of the SBP unit;
   a second ultraviolet (UV) unit downstream of the first MDG unit and upstream of the ABA module;
   a second membrane degasification (MDG) unit downstream of the CP unit; and
   an ultrafiltration (UF) unit.

\* \* \* \* \*